US012702020B2

(12) United States Patent
Koga et al.

(10) Patent No.: US 12,702,020 B2
(45) Date of Patent: Aug. 4, 2026

(54) METAL COMPONENT INCLUDING PHOSPHOROUS-CONTAINING NICKEL LAYER

(71) Applicant: MITSUI HIGH-TEC, INC., Fukuoka (JP)

(72) Inventors: Kento Koga, Fukuoka (JP); Yoshihito Miyauchi, Fukuoka (JP); Kazunori Watanabe, Fukuoka (JP); Kimihiko Kubo, Fukuoka (JP)

(73) Assignee: MITSUI HIGH-TEC, INC., Fukuoka (JP)

( * ) Notice: Subject to any disclaimer, the term of this patent is extended or adjusted under 35 U.S.C. 154(b) by 904 days.

(21) Appl. No.: 17/678,506

(22) Filed: Feb. 23, 2022

(65) Prior Publication Data

US 2022/0285252 A1     Sep. 8, 2022

(30) Foreign Application Priority Data

Mar. 4, 2021     (JP) ................................. 2021-034072

(51) Int. Cl.
H10W 70/40          (2026.01)
H10W 70/04          (2026.01)
H10W 90/00          (2026.01)

(52) U.S. Cl.
CPC ....... H10W 70/457 (2026.01); H10W 70/451 (2026.01); *H10W 70/045* (2026.01); *H10W 90/755* (2026.01)

(58) Field of Classification Search
CPC ..... H01L 23/49534; H01L 2224/85464; H01L 2224/85444; H01L 2224/83439; H01L 2224/83444; H01L 2224/83464

USPC .......................................................... 257/677
See application file for complete search history.

(56)                  References Cited

U.S. PATENT DOCUMENTS

| | | | |
|---|---|---|---|
| 5,486,721 A | 1/1996 | Herklotz et al. | |
| 6,117,566 A | 9/2000 | Matsumoto et al. | |
| 7,190,057 B2* | 3/2007 | Seki | H01L 24/48 |
| | | | 257/E23.092 |
| 2007/0052105 A1* | 3/2007 | Lau | C23C 18/1653 |
| | | | 257/E23.06 |
| 2010/0183898 A1 | 7/2010 | Imai et al. | |
| 2014/0126955 A1 | 5/2014 | Ho et al. | |

(Continued)

FOREIGN PATENT DOCUMENTS

| | | |
|---|---|---|
| CN | 110965052 A | 4/2020 |
| EP | 0 474 499 | 3/1992 |
| JP | 4-115558 | 4/1992 |

(Continued)

*Primary Examiner* — Sue A Purvis
(74) *Attorney, Agent, or Firm* — Sterne, Kessler, Goldstein & Fox P.L.L.C.

(57)                  ABSTRACT

There is provided a metal component used for manufacturing a semiconductor device, including: a base material having an electrical conductivity; a nickel layer formed on a surface of the base material and containing nickel as a main component; and a noble metal layer formed on a surface of the nickel layer. The nickel layer includes a first nickel layer not containing phosphorus, and a second nickel layer containing 0.01 to 1 in percent by weight of phosphorus. According to the metal component of the present disclosure, a thickness of the nickel layer can be reduced while good characteristics can be maintained.

8 Claims, 8 Drawing Sheets

(56) References Cited

U.S. PATENT DOCUMENTS

2016/0126204 A1     5/2016  Kadoguchi et al.

FOREIGN PATENT DOCUMENTS

| JP | H10-242372 | A | 9/1998 |
| JP | 2007-258205 | A | 10/2007 |
| JP | 2008-311316 | A | 12/2008 |
| KR | 20000007350 | A | 2/2000 |
| TW | 201417932 | A | 5/2014 |

* cited by examiner

Figure 10:
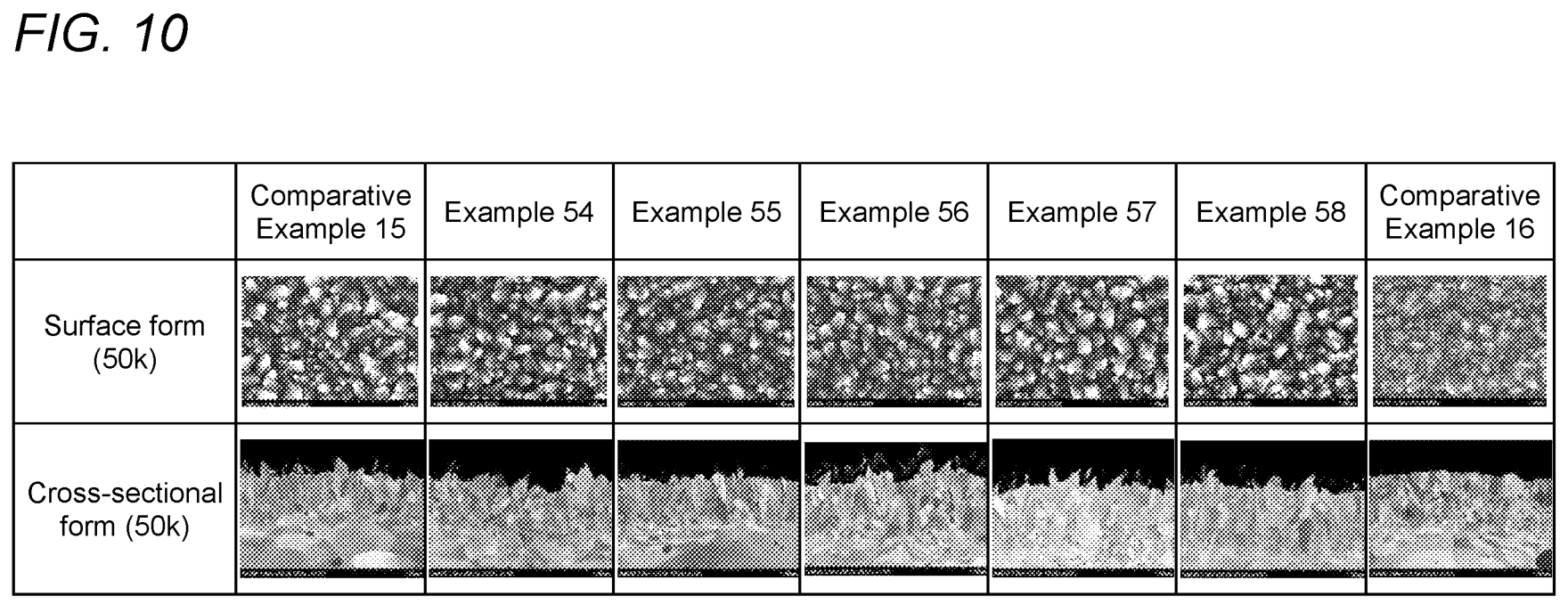

| | Comparative Example 15 | Example 54 | Example 55 | Example 56 | Example 57 | Example 58 | Comparative Example 16 |
|---|---|---|---|---|---|---|---|
| Surface form (50k) | | | | | | | |
| Cross-sectional form (50k) | | | | | | | |

METAL COMPONENT INCLUDING PHOSPHOROUS-CONTAINING NICKEL LAYER

CROSS-REFERENCE TO RELATED APPLICATIONS

This application is based on and claims priority under 35 USC 119 from Japanese Patent Application No. 2021-034072 filed on Mar. 4, 2021, the contents of which are incorporated herein by reference.

TECHNICAL FIELD

An embodiment disclosed herein relates to a metal component

BACKGROUND ART

In related art, there has been known a technique of forming a nickel plating layer on a surface of a metal base material in a metal component such as a lead frame used for manufacturing a semiconductor device. Further, as an example thereof, there has been known a technique called a pre-plated lead frame (Pd-PPF) in which a nickel plating layer, a palladium plating layer, and a gold plating layer are formed in this order on a surface of a metal base material of a lead frame (see JPH04-115558A).

However, these nickel layers have a relatively large film thickness, which increases a manufacturing cost.

SUMMARY OF INVENTION

An aspect of the embodiment provides a metal component used for manufacturing a semiconductor device, in which a thickness of a nickel layer can be reduced while good characteristics can be maintained.

According to one aspect of the embodiment, a metal component used for manufacturing a semiconductor device, includes: a base material having an electrical conductivity; a nickel layer formed on a surface of the base material and containing nickel as a main component; and a noble metal layer formed on a surface of the nickel layer. The nickel layer includes a first nickel layer not containing phosphorus, and a second nickel layer containing 0.01 to 1 in percent by weight of phosphorus.

According to one aspect of the embodiment, in a metal component used for manufacturing a semiconductor device, a thickness of the nickel layer can be reduced while good characteristics can be maintained.

BRIEF DESCRIPTION OF DRAWINGS

FIG. 9 shows SEM photographs of a surface form and a cross-sectional form of lead frames according to some embodiments.

FIG. 10 shows SEM photographs of a surface form and a cross-sectional form of lead frames according to some embodiments.

DESCRIPTION OF EMBODIMENTS

Hereinafter, a lead frame will be described as an example of a metal component used for manufacturing a semiconductor device disclosed in the present application with reference to the accompanying drawings. The present disclosure is not limited to an embodiment described below. In addition, it should be noted that the drawings are schematic, and a dimensional relationship of each element, a ratio of each element, and the like may be different from actual ones. Further, the drawings may include portions having different dimensional relationships and ratios from each other.

In related art, there has been known a technique called a Pd-PPF in which a nickel plating layer, a palladium plating layer, and a gold plating layer are formed in this order on a surface of a metal base material in a lead frame used for manufacturing a semiconductor device.

Since this Pd-PPF can achieve both wettability of a solder and bonding characteristics of a bonding wire, the use of such a Pd-PPF allows a semiconductor device to be manufactured by a simple process.

However, in the related art, when a thickness of a nickel plating layer is simply reduced, copper contained in a base material is likely to diffuse to a surface of the Pd-PPF, and thus the wettability of the solder or the like may be deteriorated. On the other hand, when the thickness of the nickel plating layer is increased, a takt time for forming the nickel plating layer becomes long, and thus the manufacturing cost may be increased.

Therefore, it is expected to implement a technique that can reduce a thickness of a nickel layer while maintaining good characteristics in the Pd-PPF by overcoming the above-described problems.

<Lead Frame and Semiconductor Device>

Figure 1:
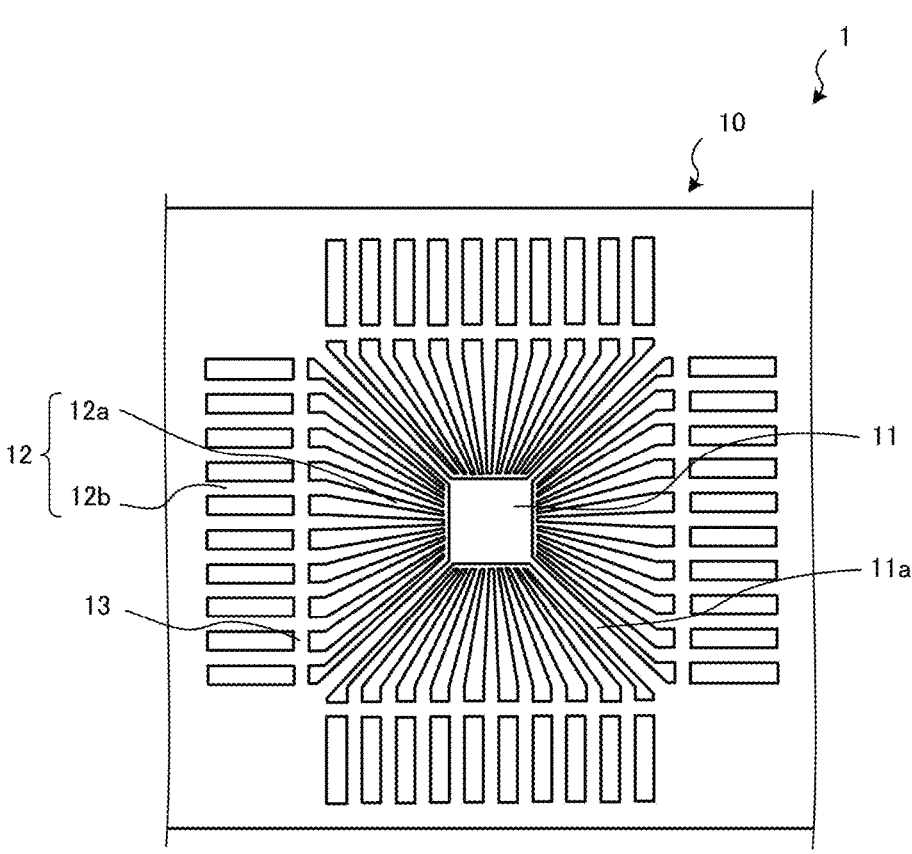
FIG. 1 is a schematic view of a lead frame according to an embodiment.
Figure 2:
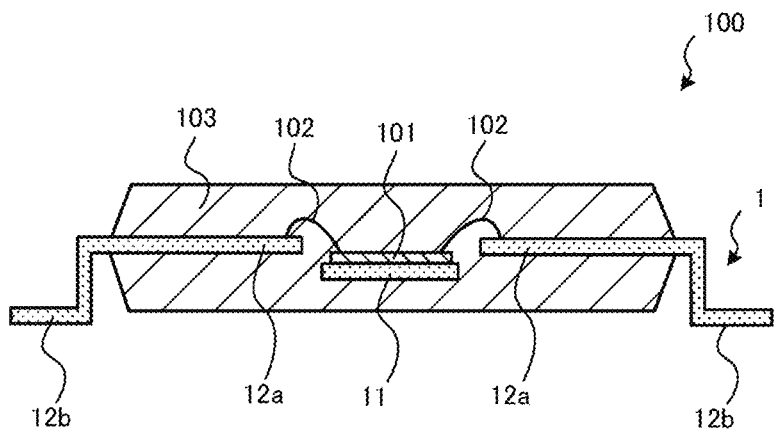
FIG. 2 is a cross-sectional view showing a semiconductor device according to the embodiment.

First, a lead frame 1 and a semiconductor device 100 according to the embodiment will be described with reference to FIGS. 1 and 2. FIG. 1 is a schematic view showing the lead frame 1 according to the embodiment, and FIG. 2 is a cross-sectional view showing the semiconductor device 100 according to the embodiment.

The lead frame 1 shown in FIG. 1 is a lead frame used for manufacturing the semiconductor device 100 of a quad flat package (QFP) type. Note that the technique of the present disclosure may be applied to a lead frame used for manufacturing semiconductor devices of other types such as a small outline package (SOP) and a quad flat non-lead package (QFN) with leads exposed on a back of a semiconductor device.

The lead frame 1 according to the embodiment has, for example, a band shape in a plan view, and a plurality of unit lead frames 10 are formed side by side along a longitudinal direction. The unit lead frame 10 is a portion corresponding to each of the semiconductor devices 100 manufactured using the lead frame 1. The plurality of unit lead frames 10 may be formed side by side not only along a longitudinal direction of the lead frame 1 but also along a width direction of the lead frame 1.

As shown in FIG. 1, the unit lead frame 10 includes a die pad 11, a plurality of leads 12, and dam bars 13. Although not shown in FIG. 1, pilot holes may be provided side by side on a side surface of a long side of the lead frame 1.

The die pad 11 is provided, for example, in a central portion of the unit lead frame 10. As shown in FIG. 2, a semiconductor element 101 can be mounted on a front side of the die pad 11.

The die pad 11 is connected to outer edge portions of the unit lead frames 10 by die pad support portions 11*a*, and is supported by the unit lead frames 10. The die pad support portions 11*a* are provided, for example, at four corners of the die pad 11, respectively.

The plurality of leads 12 are disposed side by side around the die pad 11, and each distal end portion 12*a* extends from the outer edge portion of the unit lead frame 10 toward the die pad 11. As shown in FIG. 2, the lead 12 functions as a connection terminal of the semiconductor device 100.

The lead 12 has the distal end portion 12*a* and a base end portion 12*b*. As shown in FIG. 2, in the semiconductor device 100, a bonding wire 102 formed of Cu, a Cu alloy, Au, an Au alloy, or the like is connected to the distal end portion 12*a* of the lead 12. Therefore, the lead frame 1 is required to have high bonding characteristics with the bonding wire 102. The dam bar 13 connects the adjacent leads 12 to each other.

The semiconductor device 100 includes a sealing resin 103 in addition to the lead frame 1, the semiconductor element 101, and the bonding wire 102. The sealing resin 103 is formed of, for example, an epoxy resin or the like, and is molded into a predetermined shape by a molding process or the like. The sealing resin 103 seals the semiconductor element 101, the bonding wires 102, the die pad 11, and the like.

The base end portion 12*b* of the lead 12 functions as an external terminal (outer lead) of the semiconductor device 100, and is solder-bonded to a substrate. In the semiconductor device 100 of a type in which a back surface of the die pad 11 is exposed from the sealing resin 103 or of a type in which a heat slug is provided, the back surfaces thereof are solder-bonded to the substrate. Therefore, the lead frame 1 is required to have high wettability to solder.

The dam bar 13 has a function of a dam for preventing the used resin from leaking to a base end portion 12*b* (outer lead) side in the molding process of molding the sealing resin 103, and is finally cut in the manufacturing process of the semiconductor device 100.

Embodiment

Figure 3A:
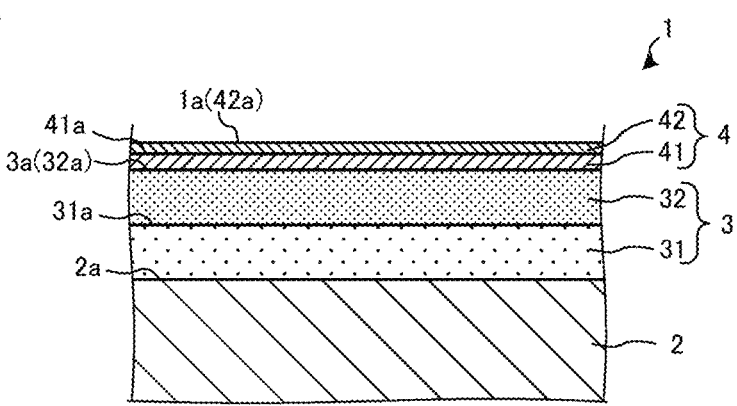
FIGS. 3A to 3C are enlarged cross-sectional views showing lead frames according to the embodiment and modifications 1 and 2 of the embodiment.

Next, details of the lead frame 1 according to the embodiment will be described with reference to FIG. 3A. FIG. 3A is an enlarged cross-sectional view of the lead frame 1 according to the embodiment.

As shown in FIG. 3A, the lead frame 1 according to the embodiment includes a base material 2, a nickel layer 3, and a noble metal layer 4. The base material 2 is formed of a material having electrical conductivity (for example, a metal material such as copper or a copper alloy). The noble metal layer 4 is formed on a surface of the nickel layer 3 and contains at least one of palladium, gold, and silver as a main component. The noble metal layer may be a single layer or a plurality of layers.

In the lead frame 1, the nickel layer 3 is formed on a surface 2*a* of the base material 2. The nickel layer 3 contains nickel (Ni) as a main component, and can be formed by, for example, a nickel plating process.

The nickel layer 3 includes a first nickel layer 31 and a second nickel layer 32. The first nickel layer 31 is a nickel layer not containing phosphorus (P). In the present disclosure, "not containing phosphorus" also includes a case of containing phosphorus, which is an inevitable impurity.

The second nickel layer 32 is a nickel layer containing phosphorus at a predetermined ratio. The second nickel layer 32 contains, for example, 0.01 (wt %) to 1 (wt %) of phosphorus. The second nickel layer 32 contains, for example, phosphorus at a predetermined ratio and has a columnar crystal structure. Here, a unit of (wt %) represents percent by weight of a substance.

In the present disclosure, the first nickel layer 31 may contain an element other than nickel, and the second nickel layer 32 may contain an element other than nickel and phosphorus.

In the embodiment, as shown in FIG. 3A, the nickel layer 3 includes two layers of the first nickel layer 31 and the second nickel layer 32. In the embodiment, the first nickel layer 31 is disposed on the surface 2*a* of the base material 2, and the second nickel layer 32 is disposed on a surface 31*a* of the first nickel layer 31.

The noble metal layer 4 is formed on a surface 3*a* of the nickel layer 3 (in the embodiment, a surface 32*a* of the second nickel layer 32). The noble metal layer 4 includes a palladium layer 41 and a gold layer 42. The palladium layer 41 contains palladium (Pd) as a main component, and can be formed by, for example, a palladium plating process. The gold layer 42 contains gold (Au) as a main component, and can be formed by, for example, gold plating.

Since the noble metal layer 4 is formed of a noble metal that is hardly oxidized, the formation of an oxide on a surface 1*a* of the lead frame 1 can be prevented in the lead frame 1 according to the embodiment. Therefore, according to the embodiment, it is possible to implement the lead frame 1 in which the wettability of the solder and the bonding characteristics of the bonding wire 102 (see FIG. 2) are compatible with each other.

The noble metal layer 4 according to the embodiment is not limited to a case where the noble metal layer 4 is formed of the palladium layer 41 and the gold layer 42, and may be formed of a silver layer containing silver (Ag) as a main component. In addition, the noble metal layer 4 according to the embodiment may be formed of only a silver layer.

Here, in the embodiment, the nickel layer 3 includes the second nickel layer 32 containing 0.01 (wt %) to 1 (wt %) of phosphorus, so that the diffusion of copper contained in the base material 2 in the second nickel layer 32 can be prevented.

This is because, inside the second nickel layer 32, the concentrated phosphorus is pinned at an interface between adjacent crystal grains, and the phosphorus inhibits the diffusion of copper.

In the embodiment, the nickel layer 3 includes the second nickel layer 32 containing phosphorus and having a columnar crystal structure, so that the diffusion of copper contained in the base material 2 in the second nickel layer 32 can be prevented.

This is because, since nickel is a columnar crystal inside the second nickel layer 32, an area of a crystal grain boundary is smaller than that in a case where nickel is a microcrystal, and phosphorus present in the crystal grain boundary having a small area inhibits the diffusion of copper.

In the embodiment, the nickel layer 3 includes the second nickel layer 32, so that the diffusion of copper to the surface 1a of the lead frame 1 can be prevented even when a thickness of the entire nickel layer 3 is reduced.

Therefore, even when the thickness of the entire nickel layer 3 is reduced, it is possible to implement the lead frame 1 in which the wettability of the solder and the bonding characteristics of the bonding wire 102 are compatible with each other since the oxidation of copper on the surface 1a can be prevented.

That is, in the embodiment, the nickel layer 3 includes the second nickel layer 32, so that the thickness of the nickel layer 3 can be reduced while good characteristics can be maintained in the Pd-PPF.

Further, in the embodiment, the nickel layer 3 includes the first nickel layer 31 not containing phosphorus, so that the thickness of the second nickel layer 32 can be reduced as compared with a case where the nickel layer 3 is formed of only the second nickel layer 32 containing phosphorus.

This is because, even when the thickness of the second nickel layer 32 is reduced, the function equivalent to that in a case where the nickel layer 3 is formed of only the second nickel layer 32 can be imparted to the nickel layer 3 by replacing the function corresponding to the reduced thickness with the first nickel layer 31.

By reducing the thickness of the second nickel layer 32, the manufacturing cost of the second nickel layer 32, which has a relatively high manufacturing cost, can be reduced. That is, according to the embodiment, the nickel layer 3 includes the first nickel layer 31 not containing phosphorus, so that the manufacturing cost of the entire nickel layer 3 can be reduced.

In the embodiment, as shown in FIG. 3A, the first nickel layer 31 may be formed on the surface 2a of the base material 2, and the second nickel layer 32 may be formed on the surface 31a of the first nickel layer 31. That is, in the embodiment, the second nickel layer 32 may be disposed closer to a surface 1a side of the lead frame 1 than the first nickel layer 31.

Thus, the second nickel layer 32 can prevent nickel contained in the first nickel layer 31 from diffusing to the surface 1a of the lead frame 1. This is because, inside the second nickel layer 32, concentrated phosphorus is present at the interface between adjacent crystal grains, and such phosphorus also inhibits diffusion of nickel.

That is, in the embodiment, the second nickel layer 32 is disposed closer to the surface 1a side of the lead frame 1 than the first nickel layer 31, so that oxidation of nickel on the surface 1a can be prevented. Therefore, according to the embodiment, it is possible to implement the lead frame 1 in which the wettability of the solder and the bonding characteristics of the bonding wire 102 are compatible with each other at a high level.

In the embodiment, the second nickel layer 32 may contain 0.01 (wt %) to 0.5 (wt %) of phosphorus. As a result, the manufacturing cost of the entire nickel layer 3 can be further reduced, and an appearance of the nickel layer 3 can be satisfactorily maintained.

In the embodiment, a ratio of the thickness of the second nickel layer 32 in the nickel layer 3 may be 50(%) or less. As a result, the manufacturing cost of the entire nickel layer 3 can be further reduced.

In the embodiment, the thickness of the second nickel layer 32 may be 0.1 (μm) or more. As a result, the diffusion of copper to the surface 1a of the lead frame 1 can be further prevented, so that the wettability of the solder on the surface 1a of the lead frame 1 can be satisfactorily maintained.

<Modification 1>

Figure 3B:
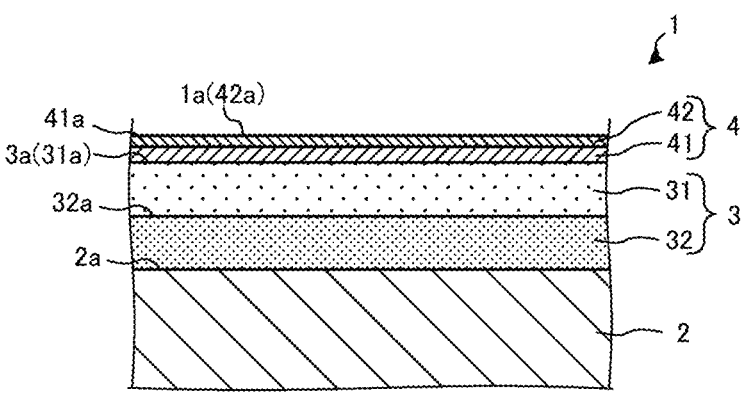

Next, various modifications of the lead frame 1 according to the embodiment will be described with reference to FIGS. 3A to 3C and FIGS. 4A to 4C. FIG. 3B is an enlarged cross-sectional view of the lead frame 1 according to Modification 1 of the embodiment. Modification 1 is different from the embodiment described above in an arrangement of the first nickel layer 31 and the second nickel layer 32 in the nickel layer 3.

Specifically, as shown in FIG. 3B, the second nickel layer 32 is formed on the surface 2a of the base material 2, and the first nickel layer 31 is formed on the surface 32a of the second nickel layer 32. Then, the palladium layer 41 of the noble metal layer 4 is formed on the surface 31a of the first nickel layer 31.

In Modification 1, as in the embodiment described above, the nickel layer 3 includes the second nickel layer 32 containing 0.01 (wt %) to 1 (wt %) of phosphorus, so that the thickness of the nickel layer 3 can be reduced while good characteristics can be maintained in the Pd-PPF.

Further, in Modification 1, as in the embodiment described above, the nickel layer 3 includes the second nickel layer 32 containing phosphorus and having a columnar crystal structure, so that the thickness of the nickel layer 3 can be reduced while good characteristics can be maintained in the Pd-PPF.

Further, in Modification 1, as in the embodiment described above, the nickel layer 3 includes the first nickel layer 31 not containing phosphorus, so that the manufacturing cost of the entire nickel layer 3 can be reduced.

In Modification 1, the second nickel layer 32 may contain 0.01 (wt %) to 0.5 (wt %) of phosphorus. As a result, the manufacturing cost of the entire nickel layer 3 can be further reduced, and an appearance of the nickel layer 3 can be satisfactorily maintained.

In Modification 1, a ratio of the thickness of the second nickel layer 32 in the nickel layer 3 may be 50(%) or less. As a result, the manufacturing cost of the entire nickel layer 3 can be further reduced.

In Modification 1, the thickness of the second nickel layer 32 may be 0.1 (μm) or more. As a result, the diffusion of copper to the surface 1a of the lead frame 1 can be further prevented, so that the wettability of the solder on the surface 1a of the lead frame 1 can be satisfactorily maintained.

<Modification 2>

Figure 3C:
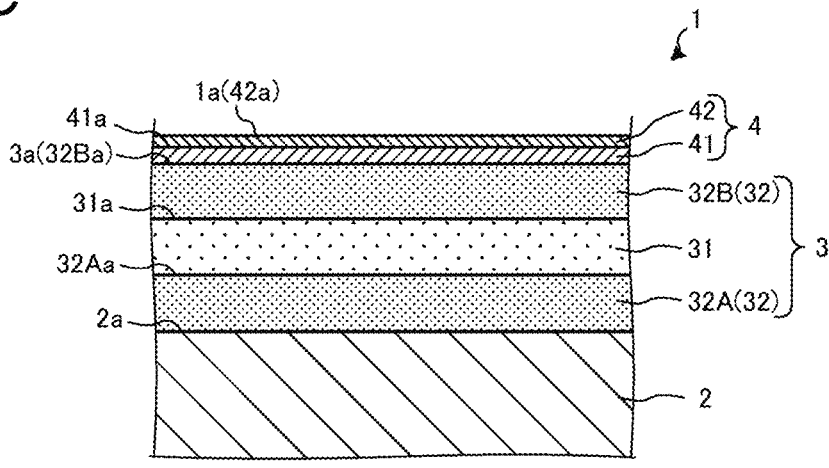

FIG. 3C is an enlarged cross-sectional view of the lead frame 1 according to modification 2 of the embodiment. Modification 2 is different from the embodiment described above and Modification 1 in a configuration of the nickel layer 3. Specifically, as shown in FIG. 3C, a second nickel layer 32A is formed on the surface 2a of the base material 2, and the first nickel layer 31 is formed on a surface 32Aa of the second nickel layer 32A.

Further, a second nickel layer 32B is formed on the surface 31a of the first nickel layer 31, and the palladium layer 41 of the noble metal layer 4 is formed on a surface 32Ba of the second nickel layer 32B. The second nickel layer 32B is an example of another second nickel layer.

As described above, the technique of the present disclosure is not limited to a case where the nickel layer 3 has two layers, and the nickel layer 3 may have a configuration of three or more layers.

In Modification 2, as in the embodiment described above, the nickel layer 3 includes the second nickel layers 32A and 32B containing 0.01 (wt %) to 1 (wt %) of phosphorus, so that the thickness of the nickel layer 3 can be reduced while good characteristics can be maintained in the Pd-PPF.

Further, in Modification 2, as in the embodiment described above, the nickel layer 3 includes the second nickel layers 32A and 32B containing phosphorus and having a columnar crystal structure, so that the thickness of the nickel layer 3 can be reduced while good characteristics can be maintained in the Pd-PPF.

Further, in Modification 2, as in the embodiment described above, the nickel layer 3 includes the first nickel layer 31 not containing phosphorus, so that the manufacturing cost of the entire nickel layer 3 can be reduced.

In Modification 2, as in the embodiment described above, the second nickel layer 32B is disposed closer to the surface 1a side of the lead frame 1 than the first nickel layer 31, so that oxidation of nickel on the surface 1a can be prevented. Therefore, according to Modification 2, it is possible to implement the lead frame 1 in which the wettability of the solder and the bonding characteristics of the bonding wire 102 (see FIG. 2) are compatible with each other at a high level.

In Modification 2, the second nickel layers 32A and 32B may contain 0.01 (wt %) to 0.5 (wt %) of phosphorus. As a result, the manufacturing cost of the entire nickel layer 3 can be further reduced, and an appearance of the nickel layer 3 can be satisfactorily maintained.

In Modification 2, a total thickness ratio of the second nickel layers 32A and 32B in the nickel layer 3 may be 50(%) or less. As a result, the manufacturing cost of the entire nickel layer 3 can be further reduced.

In Modification 2, the total thickness of the second nickel layers 32A and 32B may be 0.1 (μm) or more. As a result, the diffusion of copper to the surface 1a of the lead frame 1 can be further prevented, so that the wettability of the solder on the surface 1a of the lead frame 1 can be satisfactorily maintained.

<Modification 3>

Figure 4A:
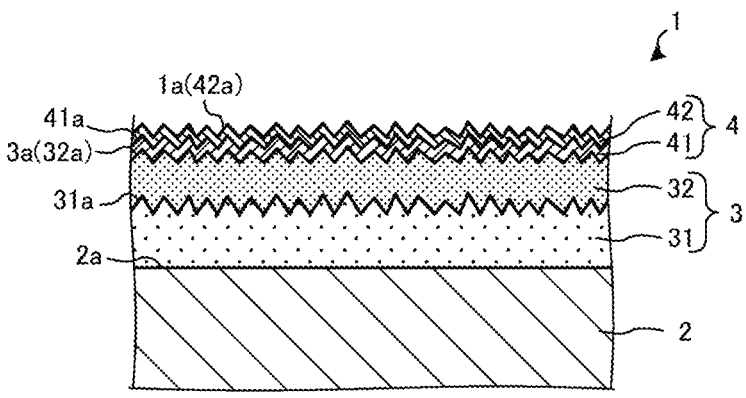
FIGS. 4A to 4C are enlarged cross-sectional views showing lead frames according to modifications 3 to 5 of the embodiment.

FIG. 4A is an enlarged cross-sectional view of the lead frame 1 according to Modification 3 of the embodiment. In Modification 3, a surface shape of the first nickel layer 31 is different from that of the embodiment described above. Specifically, as shown in FIG. 4A, in the first nickel layer 31 formed on the surface 2a of the base material 2, the surface 31a is rough. The roughened surface 31a can be formed by performing the nickel plating process of the first nickel layer 31 under an appropriate plating solution and plating formation conditions.

In Modification 3, the surfaces 32a, 41a, and 42a of the second nickel layer 32, the palladium layer 41, and the gold layer 42 sequentially formed on the surface 31a can be roughened, so that the surface 1a of the lead frame 1 can be roughened.

Thus, in Modification 3, the adhesion between the lead frame 1 and the sealing resin 103 (see FIG. 2) can be improved by a so-called anchor effect. That is, according to Modification 3, the lead frame 1 having excellent adhesion to the sealing resin 103 can be implemented, and the nickel layer 3 includes the second nickel layer 32 containing 0.01 (wt %) to 1 (wt %) of phosphorus, so that good characteristics can be obtained in the Pd-PPF.

In Modification 3, the nickel layer 3 includes the first nickel layer 31 having the roughened surface 31a and the second nickel layer 32 containing phosphorus and having a columnar crystal structure, so that adhesion to the sealing resin 103 is excellent, and good characteristics can be obtained in the Pd-PPF.

In Modification 3, as in the embodiment described above, the second nickel layer 32 is disposed closer to the surface 1a side of the lead frame 1 than the first nickel layer 31, so that oxidation of nickel on the surface 1a can be prevented. Therefore, according to Modification 3, it is possible to implement the lead frame 1 in which the wettability of the solder and the bonding characteristics of the bonding wire 102 (see FIG. 2) are compatible with each other at a high level.

In Modification 3, a thickness ratio of the second nickel layer 32 in the nickel layer 3 may be 50(%) or less. As a result, the manufacturing cost of the entire nickel layer 3 can be further reduced.

In Modification 3, the thickness of the second nickel layer 32 may be in a range of 0.1 (μm) to 0.4 (μm). By setting the thickness of the second nickel layer 32 to 0.1 (μm) or more, it is possible to further prevent the diffusion of copper to the surface 1a of the lead frame 1, and thus it is possible to maintain good solder wettability on the surface 1a of the lead frame 1.

In addition, by setting the thickness of the second nickel layer 32 to 0.4 (μm) or less, an uneven shape of the surface 1a of the lead frame 1 can be favorably maintained, and thus favorable adhesion to the sealing resin 103 can be maintained.

<Modification 4>

Figure 4B:
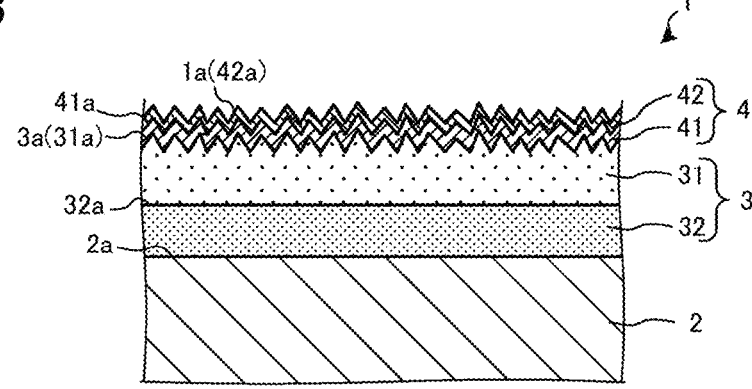

FIG. 4B is an enlarged cross-sectional view of the lead frame 1 according to Modification 4 of the embodiment. Modification 4 differs from Modification 3 in an arrangement of the first nickel layer 31 and the second nickel layer 32 in the nickel layer 3.

Specifically, as shown in FIG. 4B, the second nickel layer 32 is formed on the surface 2a of the base material 2, and the roughened first nickel layer 31 is formed on the surface 32a of the second nickel layer 32. Then, the palladium layer 41 of the noble metal layer 4 is formed on the roughened surface 31a of the first nickel layer 31.

In Modification 4, as in Modification 3 described above, the surface 31a of the first nickel layer 31 is formed as a rough surface, so that the surface 1a of the lead frame 1 can be formed as a rough surface. As a result, in Modification 4, the lead frame 1 having excellent adhesion to the sealing resin 103 can be implemented.

Further, in Modification 4, the first nickel layer 31 is disposed closer to the surface 1a side of the lead frame 1 than the second nickel layer 32, so that the surface 31a of the first nickel layer 31, which is a rough surface, can be brought closer to the surface 1a of the lead frame 1.

Therefore, in Modification 4, the surface 1a of the lead frame 1 can be formed into an uneven shape close to (that is, having a large roughness) the uneven shape formed on the surface 31a of the first nickel layer 31. Therefore, according to Modification 4, the lead frame 1 having more excellent adhesion to the sealing resin 103 can be implemented, and the nickel layer 3 includes the second nickel layer 32 containing 0.01 (wt %) to 1 (wt %) of phosphorus, so that good characteristics can be obtained in the Pd-PPF.

In Modification 4, the nickel layer 3 includes the first nickel layer 31 having the roughened surface 31a and the second nickel layer 32 containing phosphorus and having a columnar crystal structure, so that adhesion to the sealing resin 103 is excellent, and good characteristics can be obtained in the Pd-PPF.

In Modification 4, the second nickel layer 32 may contain 0.01 (wt %) to 0.5 (wt %) of phosphorus. As a result, the manufacturing cost of the entire nickel layer 3 can be further reduced, and an appearance of the nickel layer 3 can be satisfactorily maintained.

In Modification 4, a thickness ratio of the second nickel layer 32 in the nickel layer 3 may be 50(%) or less. As a result, the manufacturing cost of the entire nickel layer 3 can be further reduced.

In Modification 4, the thickness of the second nickel layer 32 may be 0.1 (μm) or more. As a result, the diffusion of copper to the surface 1a of the lead frame 1 can be further prevented, so that the wettability of the solder on the surface 1a of the lead frame 1 can be satisfactorily maintained.

<Modification 5>

Figure 4C:
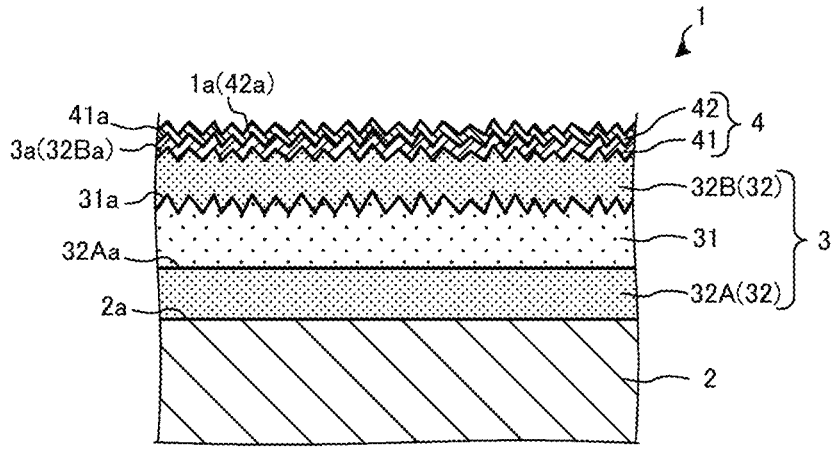

FIG. 4C is an enlarged cross-sectional view of the lead frame 1 according to Modification 5 of the embodiment. Modification 5 is different from Modification 3 and Modification 4 in a configuration of the nickel layer 3. Specifically, as shown in FIG. 4C, the second nickel layer 32A is formed on the surface 2a of the base material 2, and the roughened first nickel layer 31 is formed on the surface 32Aa of the second nickel layer 32A.

Further, the second nickel layer 32B is formed on the roughened surface 31a of the first nickel layer 31, and the palladium layer 41 of the noble metal layer 4 is formed on the surface 32Ba of the second nickel layer 32B.

In Modification 5, the surface 31a of the first nickel layer 31 is formed as a rough surface, so that the surface 1a of the lead frame 1 can be formed as a rough surface. Accordingly, in Modification 5, as in Modification 3 described above, the lead frame 1 having excellent adhesion to the sealing resin 103 can be implemented, and the nickel layer 3 includes the second nickel layers 32A and 32B containing 0.01 (wt %) to 1 (wt %) of phosphorus, so that good characteristics can be obtained in the Pd-PPF.

In Modification 5, the nickel layer 3 includes the first nickel layer 31 having the roughened surface 31a and the second nickel layers 32A and 32B containing phosphorus and having a columnar crystal structure, so that adhesion to the sealing resin 103 is excellent, and good characteristics can be obtained in the Pd-PPF.

In Modification 5, the second nickel layer 32A may contain 0.01 (wt %) to 0.5 (wt %) of phosphorus. As a result, the manufacturing cost of the entire nickel layer 3 can be further reduced, and an appearance of the nickel layer 3 can be satisfactorily maintained.

In Modification 5, as in the embodiment described above, the second nickel layer 32B is disposed closer to the surface 1a side of the lead frame 1 than the first nickel layer 31, so that oxidation of nickel on the surface 1a can be prevented. Therefore, according to Modification 5, it is possible to implement the lead frame 1 in which the wettability of the solder and the bonding characteristics of the bonding wire 102 (see FIG. 2) are compatible with each other at a high level.

In Modification 5, a total thickness ratio of the second nickel layers 32A and 32B in the nickel layer 3 may be 50(%) or less. As a result, the manufacturing cost of the entire nickel layer 3 can be further reduced.

In Modification 5, the total thickness of the second nickel layers 32A and 32B may be 0.1 (μm) or more. As a result, the diffusion of copper to the surface 1a of the lead frame 1 can be further prevented, so that the wettability of the solder on the surface 1a of the lead frame 1 can be satisfactorily maintained.

In Modification 5, the thickness of the second nickel layer 32A may be 0.1 (μm) or more. As a result, the diffusion of copper to the surface 1a of the lead frame 1 can be further prevented, so that the wettability of the solder on the surface 1a of the lead frame 1 can be satisfactorily maintained.

In Modification 5, the thickness of the second nickel layer 32B may be in a range of 0.1 (μm) to 0.4 (μm). By setting the thickness of the second nickel layer 32B to 0.1 (μm) or more, it is possible to further prevent the diffusion of copper to the surface 1a of the lead frame 1, and thus it is possible to maintain good solder wettability on the surface 1a of the lead frame 1.

In addition, by setting the thickness of the second nickel layer 32B to 0.4 (μm) or less, an uneven shape of the surface 1a of the lead frame 1 can be favorably maintained, and thus favorable adhesion to the sealing resin 103 can be maintained.

EXAMPLE

Hereinafter, a content of the present disclosure will be described in more detail with reference to Examples and Reference Examples, but the present disclosure is not limited to the following Examples.

<Evaluation 1> [Example 1]

First, a base material of a lead frame containing copper as a main component was prepared. Next, after degreasing and acid cleaning of the base material were performed, a first nickel layer not containing phosphorus was formed on a surface of the base material at a thickness of 0.1 (μm) by an electrolytic plating treatment.

The first nickel layer was formed using a Watts bath (Ni sulfate: 240 (g/L), Ni chloride: 45 (g/L), boric acid concentration: 35 (g/L), current density: 5 (A/dm$^2$), bath temperature: 50 (C), pH=3.5, anode: Ni plate). In the present disclosure, the first nickel layer was formed under the same conditions also in the following Examples 1 to 48, Reference Examples 1 to 12, and Comparative Examples 1 to 14.

Next, a second nickel layer containing 0.1 (wt %) of phosphorus was formed on a surface of the first nickel layer at a thickness of 0.1 (μm) by the electrolytic plating treatment.

The second nickel layer was formed using a Watts bath (Ni sulfate: 240 (g/L), Ni chloride: 45 (g/L), boric acid concentration: 35 (g/L), P concentration: 20 (mg/L), current density: 5 (A/dm$^2$), bath temperature: 50 (C), pH=3.5, anode: Ni plate). In the present disclosure, the second nickel layer was formed under the same conditions also in the following Examples 1 to 48 and Reference Examples 1 to 12 except for a P concentration.

A concentration of phosphorus contained in the second nickel layer was measured by the following method. First, about 80 (mg) of a nickel foil on a sample surface was weighed out, and the nickel foil was dissolved in 10 (mL) of 61(%) nitric acid (13 (mol/L)), and a total volume was adjusted to 100 (mL) using a 100 (mL) measuring flask.

Next, 10 (mL) of 61(%) nitric acid was added to 5 (mL) of a sample solution for phosphorus concentration measurement prepared above, and a total volume is adjusted to 100 (mL) using a 100 (mL) measuring flask.

Next, the concentration of phosphorus of the sample solution for phosphorus concentration measurement prepared as described above was measured using a commercially available ICP emission spectrometer (manufactured by Horiba, Ltd., product name: ULTIMA2). In the present disclosure, the concentration of phosphorus contained in the second nickel layer was measured under the same conditions also in the following Examples 1 to 48 and Reference Examples 1 to 12.

The description returns to a manufacturing process of a lead frame according to Example 1. After the formation of the second nickel layer, a palladium layer was formed on a surface of the second nickel layer at a thickness of 0.020 (μm) by the electrolytic plating treatment.

The palladium layer was formed under the following conditions: Pd concentration: 1.6 (g/L), current density: 1.0 (A/dm$^2$), bath temperature: 50 (° C.), pH=6.7, and anode: iridium oxide. In the present disclosure, the palladium layer was formed under the same conditions also in the following Examples 1 to 48, Reference Examples 1 to 12, and Comparative Examples 1 to 14.

Next, a gold layer was formed on a surface of the palladium layer at a thickness in a range of 0.004 (μm) to 0.006 (μm) by the electrolytic plating treatment. Thus, the lead frame according to Example 1 was obtained.

The gold layer was formed under the following conditions: Au concentration: 0.8 (g/L), current density: 3 (A/dm$^2$), bath temperature: 50 (° C.), pH=6.4, and anode: iridium oxide. In the present disclosure, the gold layer was formed under the same conditions also in the following Examples 1 to 48, Reference Examples 1 to 12, and Comparative Examples 1 to 14.

Examples 2 to 4

Lead frames according to Examples 2 to 4 were obtained by using the same method as that of Example 1 described above. In Examples 2 to 4, conditions of an electrolytic plating treatment were adjusted so that a film thicknesses of a first nickel layer and a second nickel layer became a film thicknesses shown in Table 1.

Example 5

First, a base material of a lead frame containing copper as a main component was prepared. Next, after degreasing and acid cleaning of the base material were performed, a second nickel layer containing 0.1 (wt %) of phosphorus was formed on a surface of the base material at a thickness of 0.1 (μm) by an electrolytic plating treatment. Next, a first nickel layer containing no phosphorus was formed on a surface of the second nickel layer at a thickness of 0.1 (μm) by the electrolytic plating treatment.

Next, a palladium layer was formed on a surface of the first nickel layer at a thickness of 0.020 (μm) by the electrolytic plating treatment. Then, a gold layer was formed on a surface of the palladium layer at a thickness in a range of 0.004 (μm) to 0.006 (μm) by the electrolytic plating treatment. Thus, a lead frame according to Example 5 was obtained.

Examples 6 to 8

Lead frames according to Examples 6 to 8 were obtained by using the same method as that of Example 5 described above. In Examples 6 to 8, conditions of an electrolytic plating treatment were adjusted so that a film thicknesses of a second nickel layer and a first nickel layer became a film thicknesses shown in Table 1.

Comparative Example 1

First, a base material of a lead frame containing copper as a main component was prepared. Next, after degreasing and acid cleaning of the base material were performed, a first nickel layer not containing phosphorus was formed on a surface of the base material at a thickness of 0.2 (μm) by an electrolytic plating treatment.

Next, a palladium layer was formed on a surface of the first nickel layer at a thickness of 0.020 (μm) by the electrolytic plating treatment. Then, a gold layer was formed on a surface of the palladium layer at a thickness in a range of 0.004 (μm) to 0.006 (μm) by the electrolytic plating treatment. Thus, a lead frame according to Comparative Example 1 was obtained.

Comparative Examples 2 to 4

Lead frames according to Comparative Examples 2 to 4 were obtained by using the same method as that of Comparative Example 1 described above. In Comparative Examples 2 to 4, conditions of an electrolytic plating treatment were adjusted so that a film thickness of a first nickel layer became a film thickness shown in Table 1.

Comparative Example 5

First, a base material of a lead frame containing copper as a main component was prepared. Next, after degreasing and acid cleaning of the base material were performed, a nickel-phosphorus (NiP) layer containing phosphorus at a ratio (6.7 (wt %) in the present disclosure) higher than that of a second nickel layer was formed on a surface of the base material at a thickness of 0.2 (μm) by an electrolytic plating treatment.

The nickel-phosphorus layer was formed using a Watts bath (Ni sulfate: 150 (g/L), Ni chloride: 150 (g/L), Nihoroid process: 200 (mL/L), manufactured by Kisai Co., Ltd., current density: 7.5 (A/dm$^2$), bath temperature: 60 (° C.), pH=0.3, and anode: Ni plate).

A concentration of phosphorus contained in the nickel-phosphorus layer was measured using a commercially available fluorescent X-ray measuring apparatus (manufactured by Fischer Instruments, product name: XDV-μ).

Next, a palladium layer was formed on a surface of the nickel-phosphorus layer at a thickness of 0.020 (μm) by the electrolytic plating treatment. Then, a gold layer was formed on a surface of the palladium layer at a thickness in a range of 0.004 (μm) to 0.006 (μm) by the electrolytic plating treatment. Thus, a lead frame according to Comparative Example 5 was obtained.

Comparative Examples 6 to 8

Lead frames according to Comparative Examples 6 to 8 were obtained by using the same method as that of Comparative Example 5 described above. In Comparative Examples 6 to 8, conditions of an electrolytic plating treatment were adjusted so that a film thickness of a nickel-phosphorus layer became a film thickness shown in Table 1.

Subsequently, with respect to the lead frames according to Examples 4 and 8 and Comparative Examples 4 and 8 obtained as described above, a cross-sectional form in the vicinity of a surface was evaluated using a commercially available scanning electron microscope (SEM) (Hitachi High-Resolution Field Emission Scanning Electron Microscope S-4800, manufactured by Hitachi High-Tech Fielding Co., Ltd.).

FIGS. 5 to 8 are SEM photographs of cross-sectional forms of the lead frames according to Examples 4 and 8 and Comparative Examples 4 and 8.

13

Figure 5:
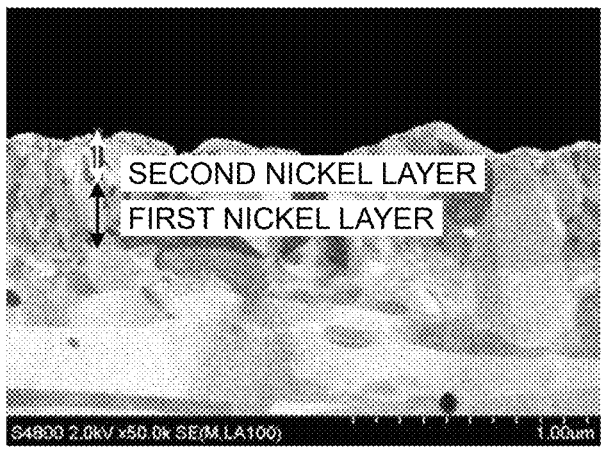
FIG. 5 is a view showing an SEM photograph of a cross-sectional form of a lead frame according to Example 4.
Figure 6:
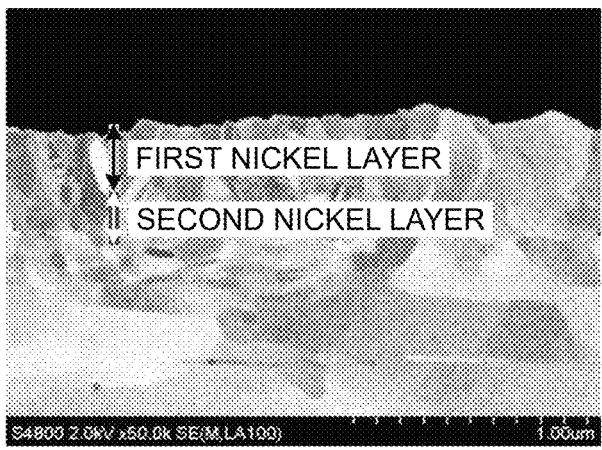
FIG. 6 is a view showing an SEM photograph of a cross-sectional form of a lead frame according to Example 8.
Figure 7:
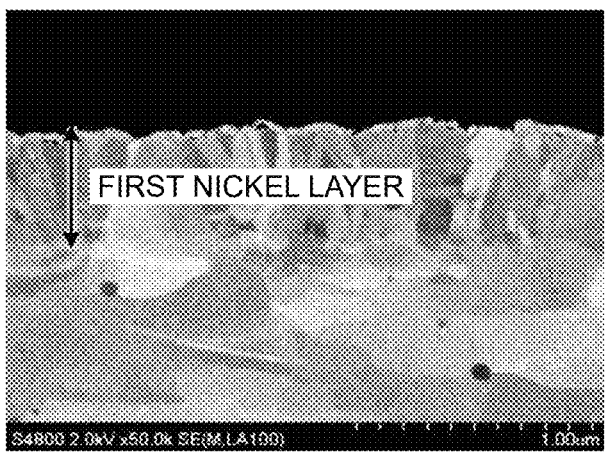
FIG. 7 is a view showing an SEM photograph of a cross-sectional form of a lead frame according to Comparative Example 4.

As shown in FIGS. 5 and 6, it can be seen that the second nickel layer of the present disclosure has a columnar crystal structure having relatively large crystal grains. In addition, it can be seen from a comparison between Examples 4 and 8 shown in FIGS. 5 and 6 and Comparative Example 4 shown in FIG. 7 that the second nickel layer of the present disclosure has the same crystal structure (columnar crystal structure having relatively large crystal grains) as that of the first nickel layer not containing phosphorus.

Figure 8:
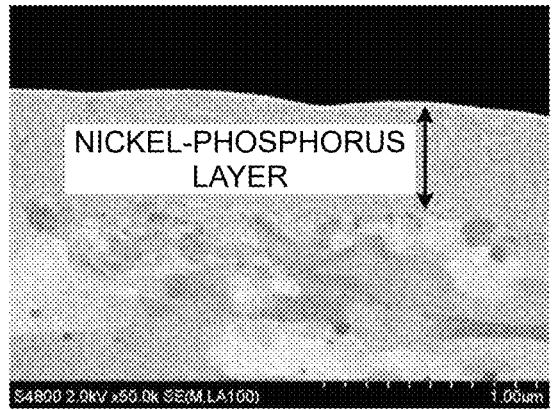
FIG. 8 is a view showing a SEM photograph of a cross-sectional form of a lead frame according to Comparative Example 8.

It can be seen from a comparison between Examples 4 and 8 shown in FIGS. 5 and 6 and Comparative Example 8 shown in FIG. 8 that the second nickel layer of the present disclosure has a crystal structure completely different from the nickel-phosphorus layer containing more phosphorus (the nickel-phosphorus layer has a microcrystalline structure having small crystal grains).

Subsequently, with respect to the lead frames according to Examples 1 to 8 and Comparative Examples 1 to 8 obtained as described above, the wettability of the solder was evaluated by using a commercially available solder-checker (product name SAT-S100, manufactured by Resca Corporation). Specifically, a zero crossing time (ZCT) was evaluated by a meniscograph method under measurement conditions described below. •Immersion speed: 5 (mm/s), •immersion depth: 1 (mm), flux: rosin flux (R type), solder: Sn-37Pb (230° C.), sample heating device: HHP-411 manufactured by AS ONE Corporation, •sample heating condition: 400 (° C.), 30 (seconds)

The shorter the zero crossing time is, the better the wettability of the solder to the lead frame is. In the present disclosure, the zero crossing time "NG" means that the zero crossing time is 10 seconds or more.

Here, for Examples 1 to 8 and Comparative Examples 1 to 8, a total film thickness of the nickel layer, a film thickness of the first nickel layer, a film thickness of the second nickel layer, a film thickness of the nickel-phosphorus layer, and measurement results of the zero crossing time were shown in Table 1.

[Table 1]

TABLE 1

| | Film thickness of nickel layer | | | | | |
| --- | --- | --- | --- | --- | --- | --- |
| | Total film thickness (µm) | First Ni layer (µm) | Second Ni layer (µm) | First Ni layer (µm) | NiP layer (µm) | ZCT (second) |
| Example 1 | 0.2 | 0.1 | 0.1 | — | — | 0.22 |
| Example 2 | 0.3 | 0.15 | 0.15 | — | — | 0.24 |
| Example 3 | 0.4 | 0.2 | 0.2 | — | — | 0.20 |
| Example 4 | 0.5 | 0.3 | 0.2 | — | — | 0.19 |
| Example 5 | 0.2 | — | 0.1 | 0.1 | — | 0.33 |
| Example 6 | 0.3 | — | 0.15 | 0.15 | — | 0.22 |
| Example 7 | 0.4 | — | 0.2 | 0.2 | — | 0.21 |
| Example 8 | 0.5 | — | 0.2 | 0.3 | — | 0.21 |
| Comparative Example 1 | 0.2 | 0.2 | — | — | — | NG |
| Comparative Example 2 | 0.3 | 0.3 | — | — | — | NG |
| Comparative Example 3 | 0.4 | 0.4 | — | — | — | NG |
| Comparative Example 4 | 0.5 | 0.5 | — | — | — | 1.24 |
| Comparative Example 5 | 0.2 | — | — | — | 0.2 | 1.52 |
| Comparative Example 6 | 0.3 | — | — | — | 0.3 | 1.09 |

14

TABLE 1-continued

| | Film thickness of nickel layer | | | | | |
| --- | --- | --- | --- | --- | --- | --- |
| | Total film thickness (µm) | First Ni layer (µm) | Second Ni layer (µm) | First Ni layer (µm) | NiP layer (µm) | ZCT (second) |
| Comparative Example 7 | 0.4 | — | — | — | 0.4 | 1.04 |
| Comparative Example 8 | 0.5 | — | — | — | 0.5 | 0.74 |

It can be seen that all the zero crossing times of the lead frames according to Examples 1 to 8 were within 1 (second). Therefore, according to the embodiment, when the second nickel layer containing 0.1 (wt %) of phosphorus and having a film thickness of 0.1 (µm) or more is contained in the nickel layer, a lead frame having excellent solder wettability can be implemented.

It can be seen from a comparison between Examples 1 to 8 and Comparative Examples 1 to 4 that the wettability of the solder is improved by forming the nickel layer with the first nickel layer containing no phosphorus and the second nickel layer containing phosphorus.

It can be seen from a comparison between Examples 1 to 8 and Comparative Examples 5 to 8 that the wettability of the solder is improved by using the second nickel layer having a columnar crystal structure instead of the nickel-phosphorus layer having a microcrystalline structure.

<Evaluation 2> [Example 9]

First, a base material of a lead frame containing copper as a main component was prepared. Next, after degreasing and acid cleaning of the base material were performed, a first nickel layer not containing phosphorus was formed on a surface of the base material at a thickness of 0.1 (µm) by an electrolytic plating treatment. Next, a second nickel layer containing 0.1 (wt %) of phosphorus was formed on a surface of the first nickel layer at a thickness of 0.1 (µm) by the electrolytic plating treatment.

Next, a palladium layer was formed on a surface of the second nickel layer at a thickness of 0.020 (µm) by the electrolytic plating treatment. Then, a gold layer was formed on a surface of the palladium layer at a thickness in a range of 0.004 (µm) to 0.006 (µm) by the electrolytic plating treatment. Thus, a lead frame according to Example 9 was obtained.

Examples 10 to 12 and Reference Examples 1 and 2

Lead frames according to Examples 10 to 12 and Reference Examples 1 and 2 were obtained by using the same method as in Example 9 described above. In Examples 10 to 12 and Reference Examples 1 and 2, conditions of an electrolytic plating treatment were adjusted so that a film thicknesses of a first nickel layer and ta second nickel layer became a film thicknesses shown in Table 2.

Subsequently, with respect to the lead frames according to Examples 17 to 23 and Reference Example 5 obtained as described above, whether an appearance was good was visually evaluated. In terms of appearance, those with uneven color tone of a lead frame were regarded as poor appearance.

Here, for Examples 17 to 23 and Reference Example 5, a total film thickness of the nickel layer, a film thickness of the first nickel layer, a film thickness of the second nickel layer, and evaluation results of the appearance were shown in Table 3.

[Table 3]

TABLE 3

| | Content of | Film thickness of nickel layer | | | |
| | P of second Ni layer (wt %) | First Ni layer (μm) | Second Ni layer (μm) | Total film thickness (μm) | Appear-ance |
|---|---|---|---|---|---|
| Example 17 | 0.01 | 1.0 | 1.0 | 2.0 | OK |
| Example 18 | 0.05 | | | | OK |
| Example 19 | 0.1 | | | | OK |
| Example 20 | 0.2 | | | | OK |
| Example 21 | 0.3 | | | | OK |
| Example 22 | 0.4 | | | | OK |
| Example 23 | 0.5 | | | | OK |
| Reference Example 5 | 0.6 | | | | NG |

It can be seen that the lead frames according to Examples 17 to 23 all had good appearance. Therefore, according to the embodiment, the second nickel layer containing phosphorus in a range of 0.01 (wt %) to 0.5 (wt %) is disposed closer to a surface side of the lead frame than the first nickel layer, so that a lead frame having a good appearance can be implemented.

<Evaluation 4> [Example 24]

First, a base material of a lead frame containing copper as a main component was prepared. Next, after degreasing and acid cleaning of the base material were performed, the second nickel layer containing 0.01 (wt %) of phosphorus was formed on a surface of the base material at a thickness of 1.0 (μm) by an electrolytic plating treatment. Next, a first nickel layer containing no phosphorus was formed on a surface of the second nickel layer at a thickness of 1.0 (μm) by the electrolytic plating treatment.

Next, a palladium layer was formed on a surface of the first nickel layer at a thickness of 0.020 (μm) by the electrolytic plating treatment. Then, a gold layer was formed on a surface of the palladium layer at a thickness in a range of 0.004 (μm) to 0.006 (μm) by the electrolytic plating treatment. Thus, a lead frame according to Example 24 was obtained.

Examples 25 to 30 and Reference Example 6

Lead frames according to Examples 25 to 30 and Reference Example 6 were obtained by using the same method as in Example 24 described above. In Examples 25 to 30 and Reference Example 6, conditions of an electrolytic plating treatment were adjusted so that a content of phosphorus in a second nickel layer became a content shown in Table 4.

Subsequently, with respect to the lead frames according to Examples 24 to 30 and Reference Example 6 obtained as described above, whether an appearance was good was visually evaluated. In terms of appearance, those with uneven color tone of a lead frame were regarded as poor appearance.

Here, for Examples 24 to 30 and Reference Example 6, a total film thickness of the nickel layer, a film thickness of the first nickel layer, a film thickness of the second nickel layer, and evaluation results of the appearance were shown in Table 4.

[Table 4]

TABLE 4

| | Content of | Film thickness of nickel layer | | | |
| | P of second Ni layer (wt %) | Second Ni layer (μm) | First Ni layer (μm) | Total film thickness (μm) | Appear-ance |
|---|---|---|---|---|---|
| Example 24 | 0.01 | 1.0 | 1.0 | 2.0 | OK |
| Example 25 | 0.05 | | | | OK |
| Example 26 | 0.1 | | | | OK |
| Example 27 | 0.2 | | | | OK |
| Example 28 | 0.3 | | | | OK |
| Example 29 | 0.4 | | | | OK |
| Example 30 | 0.5 | | | | OK |
| Reference Example 6 | 0.6 | | | | NG |

It can be seen that the lead frames according to Examples 24 to 30 all had good appearance. Therefore, according to the embodiment, the second nickel layer containing phosphorus in a range of 0.01 (wt %) to 0.5 (wt %) is disposed closer to a surface side of the base material than the first nickel layer, so that a lead frame having a good appearance can be implemented.

<Evaluation 5> [Example 31]

First, a base material of a lead frame containing copper as a main component was prepared. Next, after degreasing and acid cleaning of the base material were performed, a first nickel layer not containing phosphorus was formed on a surface of the base material at a thickness of 0.1 (μm) by an electrolytic plating treatment. Next, a second nickel layer containing 0.1 (wt %) of phosphorus was formed on a surface of the first nickel layer at a thickness of 0.1 (μm) by the electrolytic plating treatment.

Next, a palladium layer was formed on a surface of the second nickel layer at a thickness of 0.005 (μm) by the electrolytic plating treatment. Then, a gold layer was formed on a surface of the palladium layer at a thickness in a range of 0.004 (μm) to 0.006 (μm) by the electrolytic plating treatment. Thus, a lead frame according to Example 31 was obtained.

Examples 32 to 36 and Reference Examples 7 to 9

Lead frames according to Examples 32 to 36 and Reference Examples 7 to 9 were obtained by using the same method as that of Example 31 described above. In Examples 32 to 36 and Reference Examples 7 to 9, conditions of an electrolytic plating treatment were adjusted so that a film thicknesses of a first nickel layer, a second nickel layer, and a palladium layer became a film thicknesses shown in Table 5.

Subsequently, with respect to the lead frames according to Examples 31 to 36 and Reference Examples 7 to 9 obtained as described above, the wettability of a solder (a zero crossing time by a meniscograph method) was evaluated by the same method as in Evaluation 1 described above.

Here, for Examples 31 to 36 and Reference Examples 7 to 9, a total film thickness of the nickel layer, a film thickness of the first nickel layer, a film thickness of the second nickel layer, a film thickness of the palladium layer, and measurement results of a zero crossing time were shown in Table 5.

[Table 5]

TABLE 5

| | Film thickness of nickel layer | | | Film | |
| | First Ni layer (μm) | Second Ni layer (μm) | Total film thickness (μm) | thickness of palladium layer (μm) | ZCT (second) |
|---|---|---|---|---|---|
| Reference Example 7 | 0.05 | 0.05 | 0.1 | 0.005 | NG |
| Example 31 | 0.1 | 0.1 | 0.2 | | 0.34 |
| Example 32 | 0.2 | 0.2 | 0.4 | | 0.34 |
| Reference Example 8 | 0.05 | 0.05 | 0.1 | 0.010 | NG |
| Example 33 | 0.1 | 0.1 | 0.2 | | 0.39 |
| Example 34 | 0.2 | 0.2 | 0.4 | | 0.20 |
| Reference Example 9 | 0.05 | 0.05 | 0.1 | 0.015 | NG |
| Example 35 | 0.1 | 0.1 | 0.2 | | 0.34 |
| Example 36 | 0.2 | 0.2 | 0.4 | | 0.18 |

It can be seen that all the zero crossing times of the lead frames according to Examples 31 to 36 were within 1 (second). Further, it can be seen that the wettability of the solder can be satisfactorily maintained even when the palladium layer is made thin. Therefore, according to the embodiment, the second nickel layer containing 0.1 (wt %) of phosphorus and having a film thickness of 0.1 (μm) or more is by disposed closer to a surface side of the lead frame than the first nickel layer, so that a lead frame having excellent solder wettability can be implemented.

<Evaluation 6> [Example 37]

First, a base material of a lead frame containing copper as a main component was prepared. Next, after degreasing and acid cleaning of the base material were performed, a second nickel layer containing 0.1 (wt %) of phosphorus was formed on a surface of the base material at a thickness of 0.1 (μm) by an electrolytic plating treatment. Next, a first nickel layer containing no phosphorus was formed on a surface of the second nickel layer at a thickness of 0.1 (μm) by the electrolytic plating treatment.

Next, a palladium layer was formed on a surface of the first nickel layer at a thickness of 0.005 (μm) by the electrolytic plating treatment. Then, a gold layer was formed on a surface of the palladium layer at a thickness in a range of 0.004 (μm) to 0.006 (μm) by the electrolytic plating treatment. Thus, a lead frame according to Example 37 was obtained.

Examples 38 to 42 and Reference Examples 10 to 12

Lead frames according to Examples 38 to 42 and Reference Examples 10 to 12 were obtained by using the same method as that of Example 37 described above. In Examples 38 to 42 and Reference Examples 10 to 12, conditions of an electrolytic plating treatment were adjusted so that a film thicknesses of a second nickel layer, a first nickel layer, and a palladium layer became a film thicknesses shown in Table 6.

Subsequently, with respect to the lead frames according to Examples 37 to 42 and Reference Examples 10 to 12 obtained as described above, the wettability of a solder (a zero crossing time by a meniscograph method) was evaluated by the same method as in Evaluation 1 described above.

Here, for Examples 37 to 42 and Reference Examples 10 to 12, a total film thickness of the nickel layer, a film thickness of the first nickel layer, a film thickness of the second nickel layer, a film thickness of the palladium layer, and measurement results of the zero crossing time were shown in Table 6.

[Table 6]

TABLE 6

| | Film thickness of nickel layer | | | Film | |
| | Second Ni layer (μm) | First Ni layer (μm) | Total film thickness (μm) | thickness of palladium layer (μm) | ZCT (second) |
|---|---|---|---|---|---|
| Reference Example 10 | 0.05 | 0.05 | 0.1 | 0.005 | NG |
| Example 37 | 0.1 | 0.1 | 0.2 | | 0.88 |
| Example 38 | 0.2 | 0.2 | 0.4 | | 0.63 |
| Reference Example 11 | 0.05 | 0.05 | 0.1 | 0.010 | NG |
| Example 39 | 0.1 | 0.1 | 0.2 | | 0.38 |
| Example 40 | 0.2 | 0.2 | 0.4 | | 0.21 |
| Reference Example 12 | 0.05 | 0.05 | 0.1 | 0.015 | NG |
| Example 41 | 0.1 | 0.1 | 0.2 | | 0.36 |
| Example 42 | 0.2 | 0.2 | 0.4 | | 0.25 |

It can be seen that all the zero crossing times of the lead frames according to Examples 37 to 42 were within 1 (second). Further, it can be seen that the wettability of the solder can be satisfactorily maintained even when the palladium layer is made thin. Therefore, according to the embodiment, the second nickel layer containing 0.1 (wt %) of phosphorus and having a film thickness of 0.1 (μm) or more is disposed closer to a surface side of the base material than the first nickel layer, so that a lead frame having excellent solder wettability can be implemented.

In addition, it can be seen from a comparison between Examples 37 and 38 and Examples 31 and 32 shown in Evaluation 5 that the solder wettability can be further improved by disposing the second nickel layer closer to a surface side of the lead frame than the first nickel layer.

<Evaluation 7> [Example 43]

First, a base material of a lead frame containing copper as a main component was prepared. Next, after degreasing and acid cleaning of the base material were performed, a first nickel layer not containing phosphorus was formed on a surface of the base material at a thickness of 0.1 (μm) by an electrolytic plating treatment. Next, a second nickel layer containing 0.1 (wt %) of phosphorus was formed on the surface of the first nickel layer at a thickness of 0.2 (μm) by the electrolytic plating treatment.

Next, a palladium layer was formed on a surface of the second nickel layer at a thickness of 0.020 (μm) by the electrolytic plating treatment. Then, a gold layer was formed on a surface of the palladium layer at a thickness in a range of 0.004 (μm) to 0.006 (μm) by the electrolytic plating treatment. Thus, a lead frame according to Example 43 was obtained.

Examples 44 and 45

Lead frames according to Examples 44 and 45 were obtained by using the same method as that of Example 43 described above. In Examples 44 and 45, conditions of an electrolytic plating treatment were adjusted so that a film thicknesses of a first nickel layer and a second nickel layer became a film thicknesses shown in Table 7.

Subsequently, with respect to the lead frames according to Examples 43 to 45 obtained as described above, the wettability of a solder (a zero crossing time by a meniscograph method) was evaluated by the same method as in Evaluation 1 described above.

Here, for Examples 43 to 45, a film thickness ratio of the second nickel layer, a total film thickness of the nickel layer, a film thickness of the first nickel layer, a film thickness of the second nickel layer, a film thickness of the palladium layer, and measurement results of the zero crossing time were shown in Table 7.

[Table 7]

TABLE 7

|  | Film thickness ratio of second Ni layer | Film thickness of nickel layer | | | |
|  | | First Ni layer (μm) | Second Ni layer (μm) | Total film thickness (μm) | ZCT (second) |
|---|---|---|---|---|---|
| Example 43 | 33% | 0.1 | 0.2 | 0.3 | 0.33 |
| Example 44 | 50% | 0.1 | 0.1 | 0.2 | 0.32 |
| Example 45 | 67% | 0.1 | 0.05 | 0.15 | 0.89 |

It can be seen that all the zero crossing times of the lead frames according to Examples 43 to 45 were within 1 (second). Therefore, according to the embodiment, the second nickel layer containing 0.1 (wt %) of phosphorus and having a film thickness ratio in a range of 33(%) to 67(%) is disposed closer to a surface side of the lead frame than the first nickel layer, so that a lead frame having excellent solder wettability can be implemented.

<Evaluation 8> [Example 46]

First, a base material of a lead frame containing copper as a main component was prepared. Next, after degreasing and acid cleaning of the base material were performed, a second nickel layer containing 0.1 (wt %) of phosphorus was formed on a surface of the base material at a thickness of 0.1 (μm) by an electrolytic plating treatment. Next, a first nickel layer containing no phosphorus was formed on a surface of the second nickel layer at a thickness of 0.2 (μm) by the electrolytic plating treatment.

Next, a palladium layer was formed on a surface of the first nickel layer at a thickness of 0.020 (μm) by the electrolytic plating treatment. Then, a gold layer was formed on a surface of the palladium layer at a thickness in a range of 0.004 (μm) to 0.006 (μm) by the electrolytic plating treatment. Thus, a lead frame according to Example 46 was obtained.

Examples 47 and 48

Lead frames according to Examples 47 and 48 were obtained by using the same method as that of Example 46 described above. In Examples 47 and 48, conditions of an electrolytic plating treatment were adjusted so that a film thicknesses of a second nickel layer and a first nickel layer became a film thicknesses shown in Table 8.

Subsequently, with respect to the lead frames according to Examples 46 to 48 obtained as described above, the wettability of a solder (a zero crossing time by a meniscograph method) was evaluated by the same method as in Evaluation 1 described above.

Here, for Examples 46 to 48, a film thickness ratio of the second nickel layer, a total film thickness of the nickel layer, a film thickness of the first nickel layer, a film thickness of the second nickel layer, a film thickness of the palladium layer, and measurement results of the zero crossing time were shown in Table 8.

[Table 8]

TABLE 8

|  | Film thickness ratio of second Ni layer | Film thickness of nickel layer | | | |
|  | | Second Ni layer (μm) | First Ni layer (μm) | Total film thickness (μm) | ZCT (second) |
|---|---|---|---|---|---|
| Example 46 | 33% | 0.1 | 0.2 | 0.3 | 0.22 |
| Example 47 | 50% | 0.1 | 0.1 | 0.2 | 0.33 |
| Example 48 | 67% | 0.1 | 0.05 | 0.15 | 0.25 |

It can be seen that all the zero crossing times of the lead frames according to Examples 46 to 48 were within 1 (second). Therefore, according to the embodiment, the second nickel layer containing 0.1 (wt %) of phosphorus and having a film thickness ratio in a range of 33(%) to 67(%) is disposed closer to a surface side of the base material than the first nickel layer, so that a lead frame having excellent solder wettability can be implemented.

<Evaluation 9> [Example 49]

First, a base material of a lead frame containing copper as a main component was prepared. Next, after degreasing and acid cleaning of the base material were performed, a first nickel layer not containing phosphorus was formed on a surface of the base material at a thickness of 0.7 (μm) by an electrolytic plating treatment. The first nickel layer was formed using a sulfamate bath (Ni concentration: 145 (g/L), Cl concentration: 100 (g/L), boric acid concentration: 30 (g/L), current density: 6 (A/dm$^2$), bath temperature: 45 (° C.), pH=3.7, and anode: Ni plate). A surface of the first nickel layer is rough.

Next, a second nickel layer containing 0.1 (wt %) of phosphorus was formed on the roughened surface of the first nickel layer at a thickness of 0.05 (μm) by the electrolytic plating treatment. Thus, a lead frame according to Example 49 was obtained.

Examples 50 to 53

Lead frames according to Examples 50 to 53 were obtained by using the same method as that of Example 49 described above. In Examples 50 to 53, conditions of an electrolytic plating treatment were adjusted so that a film thickness of a first nickel layer and a film thickness of a second nickel layer became a film thicknesses shown in Table 9.

Comparative Example 15

A first nickel layer containing no phosphorus was formed at a thickness of 0.7 (μm) by the same method as in Example 49. Thus, a lead frame according to Comparative Example 15 was obtained.

23 24

Comparative Example 16

First, a base material of a lead frame containing copper as a main component was prepared. Next, after degreasing and acid cleaning of the base material were performed, a first nickel layer not containing phosphorus was formed on a surface of the base material at a thickness of 0.8 (μm) by an electrolytic plating treatment. The first nickel layer was formed using a Watts bath (Ni sulfate: 240 (g/L), Ni chloride: 45 (g/L), boric acid concentration: 35 (g/L), current density: 5 (A/dm²), bath temperature: 50 (° C.), pH=3.5, anode: Ni plate). A surface of the first nickel layer is smooth. Thus, a lead frame according to Comparative Example 16 was obtained.

Subsequently, with respect to the lead frames according to Examples 49 to 53 and Comparative Examples 15 and 16 obtained as described above, the adhesion of the resin was evaluated using a commercially available tester (trade name: DAGE 4000 plus, manufactured by Noston-Advance Technology Inc.). Specifically, a shear force was evaluated by a coupling shear test under the following measurement conditions. •Mold resin: EME-G631H, •molding temperature: 175 (° C.), after-cure: 175 (° C.), 4 (hours)

The larger the value of the shear force in the coupling test is, the better the adhesion of the resin to the lead frame is.

Next, a palladium layer and a gold layer were formed on surfaces of the lead frames according to Examples 49 to 53 and Comparative Example 15. For these lead frames, a minimum film thickness of the palladium layer at which a zero crossing time of 1 second or less was achieved by a meniscograph method was evaluated. A thickness of the gold layer was in a range of 0.004 (μm) to 0.006 (μm).

Here, for Examples 49 to 53 and Comparative Examples 15 and 16, a film thicknesses of the first nickel layer and the second nickel layer, the minimum film thickness of the palladium layer at which a zero crossing time of 1 second or less was achieved, and an evaluation of the resin adhesion. [Table 9]

TABLE 9

| | | Comparative Example 15 | Example 49 | Example 50 | Example 51 | Example 52 | Example 53 | Comparative Example 16 |
|---|---|---|---|---|---|---|---|---|
| Film thickness of nickel layer (μm) | Second Ni layer | — | 0.05 | 0.1 | 0.2 | 0.3 | 0.4 | — |
| | First Ni layer (rough surface) | 0.7 | 0.7 | 0.7 | 0.7 | 0.7 | 0.7 | — |
| | First Ni layer (smooth surface) | — | — | — | — | — | — | 0.8 |
| Evaluation of resin adhesion (MPa) | | 13.7 | 12.9 | 11.8 | 10.8 | 10.3 | 9.0 | 8.4 |
| Minimum film thickness (μm) of Pd layer at which ZCT ≤ 1 (second) is achieved | | 0.046 | 0.016 | 0.010 | 0.010 | 0.009 | 0.008 | — |

Figure 9:
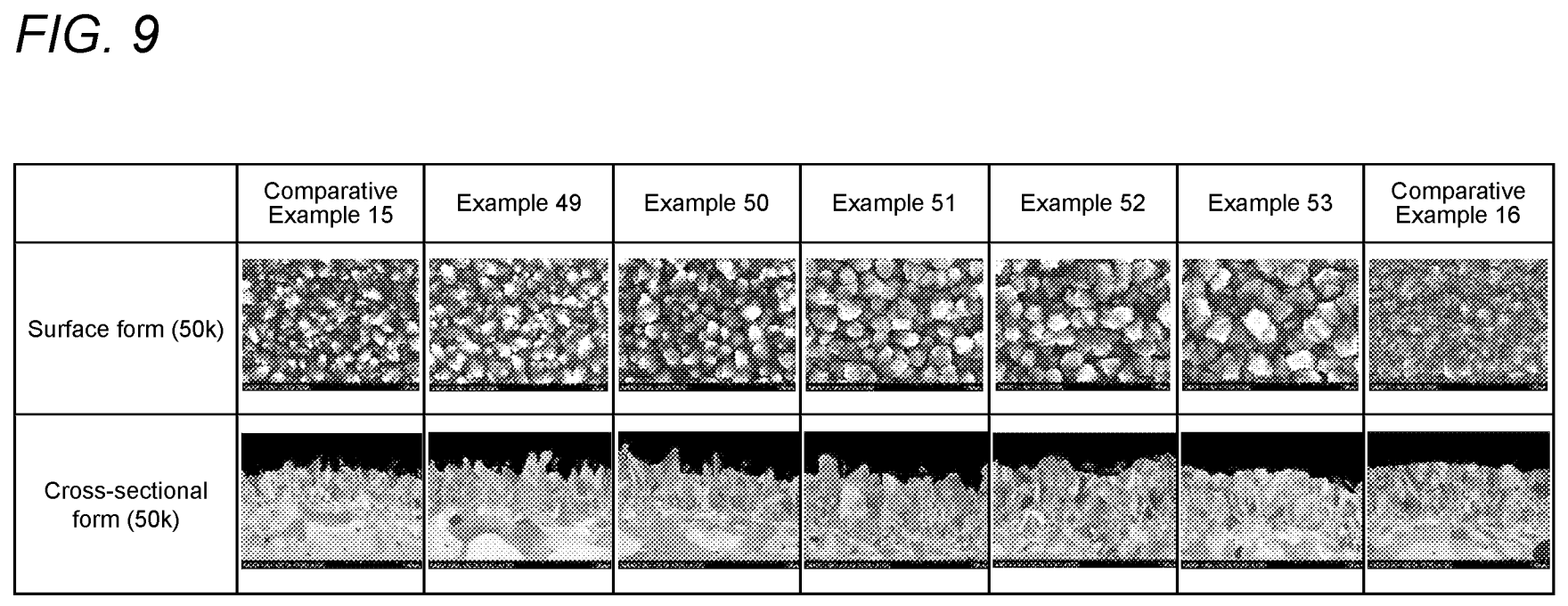

FIG. 9 shows SEM photographs of a surface form and a cross-sectional form of the lead frame for Examples 49-53 as well as for Comparative Examples 15 and 16.

It can be seen from a comparison between Examples 49 to 53 and Comparative Example 15 that by disposing the second nickel layer containing 0.1 (wt %) of phosphorus closer to the surface side of the lead frame than the first nickel layer, the wettability of the solder can be favorably maintained even when the palladium layer was thinned.

In addition, it can be seen from a comparison between Examples 49 to 53 and Comparative Example 16 that the adhesion of the resin to the lead frame can be improved by roughening the surface of the first nickel layer.

<Evaluation 10> [Example 54]

First, a base material of a lead frame containing copper as a main component was prepared. Next, after degreasing and acid cleaning of the base material were performed, the second nickel layer containing 0.1 (wt %) of phosphorus was formed on a surface of the base material at a thickness of 0.05 (μm) by an electrolytic plating treatment.

Next, a first nickel layer containing no phosphorus was formed on a surface of the second nickel layer at a thickness of 0.7 (μm) by the electrolytic plating treatment. The first nickel layer was formed using a sulfamate bath (Ni concentration: 145 (g/L), Cl concentration: 100 (g/L), boric acid concentration: 30 (g/L), current density: 6 ($A/dm^2$), bath temperature: 45 (° C.), pH=3.7, and anode: Ni plate). A surface of the first nickel layer is rough. Thus, a lead frame according to Example 54 was obtained.

Examples 55 to 58

Lead frames according to Examples 55 to 58 were obtained by using the same method as that of Example 54 described above. In Examples 55 to 58, conditions of an electrolytic plating treatment were adjusted so that a film thickness of a second nickel layer and a film thickness of a first nickel layer became a film thicknesses shown in Table 10.

Subsequently, with respect to the lead frames according to Examples 54 to 58 obtained as described above, the adhesion of the resin (a shear force by a coupling shear test) was evaluated by the same method as in Evaluation 9 described above.

Next, a palladium layer and a gold layer were formed on surfaces of the lead frames according to Examples 54 to 58. For these lead frames, a minimum film thickness of the palladium layer at which a zero crossing time of 1 second or less was achieved by a meniscograph method was evaluated. A thickness of the gold layer was in a range of 0.004 (μm) to 0.006 (μm).

For Examples 54 to 58 and Comparative Examples 15 and 16, a film thicknesses of the first nickel layer and the second nickel layer, a minimum film thickness of the palladium layer at which a zero crossing time of 1 second or less was achieved, and an evaluation of the resin adhesion.
[Table 10]

TABLE 10

| | | Comparative Example 15 | Example 54 | Example 55 | Example 56 | Example 57 | Example 58 | Comparative Example 16 |
|---|---|---|---|---|---|---|---|---|
| Film thickness of nickel layer (μm) | First Ni layer (rough surface) | 0.7 | 0.7 | 0.7 | 0.7 | 0.7 | 0.7 | — |
| | Second Ni layer | — | 0.05 | 0.1 | 0.2 | 0.3 | 0.4 | — |
| | First Ni layer (smooth surface) | — | — | — | — | — | — | 0.8 |
| Evaluation of resin adhesion (MPa) | | 13.7 | 13.8 | 13.5 | 13.8 | 13.7 | 13.8 | 8.4 |
| Minimum film thickness (μm) of Pd layer at which ZCT ≤ 1 (second) is achieved | | 0.046 | 0.028 | 0.017 | 0.017 | 0.017 | 0.017 | — |

FIG. 10 shows SEM photographs of a surface form and a cross-sectional form of the lead frame for Examples 54-58 as well as for Comparative Examples 15 and 16.

It can be seen from a comparison between Examples 54 to 58 and Comparative Example 15 that by disposing the second nickel layer containing 0.1 (wt %) of phosphorus closer to a surface side of a base material than the first nickel layer, the wettability of the solder can be favorably maintained even when the palladium layer was thinned.

It can be seen from a comparison between Examples 54 to 58 and Comparative Example 16 that the adhesion of the resin to the lead frame can be improved by roughening a surface of the first nickel layer.

It can be seen from a comparison between Examples 54 to 58 and Examples 49 to 53 shown in Evaluation 9 that the adhesion of the resin can be further improved by disposing the roughened first nickel layer closer to a surface side of the lead frame than the second nickel layer.

It can be seen from a comparison between Examples 54 to 58 and Examples 49 to 53 that by disposing the second nickel layer closer to a surface side of the lead frame than the roughened first nickel layer, the wettability of the solder could be favorably maintained even when the palladium layer was further thinned.

Although the embodiments of the present invention have been described above, the present invention is not limited to the embodiments described above, and various modifications can be made without departing from the gist of the present invention. For example, after degreasing and acid cleaning of the base material of the lead frame containing copper as a main component, a surface treatment such as chemical polishing or electrolytic polishing may be performed. Another metal layer may be provided between the lead frame base material and the nickel layer.

As described above, the metal component (lead frame 1) according to the embodiment includes the base material 2, the nickel layer 3, and the noble metal layer 4 in the metal component used for manufacturing a semiconductor device. The base material 2 has electrical conductivity. The nickel layer 3 is formed on the surface 2a of the base material 2 and contains nickel as a main component. The noble metal layer 4 is formed on the surface 3a of the nickel layer 3. The nickel layer 3 includes the first nickel layer 31 not containing phosphorus and the second nickel layer 32 containing 0.01 (wt %) to 1 (wt %) of phosphorus. As a result, in the metal component used for manufacturing a semiconductor device 100, the thickness of the nickel layer 3 can be reduced while good characteristics can be maintained.

In the metal component (lead frame 1) according to the embodiment, the second nickel layer 32 contains 0.01 (wt %) to 0.5 (wt %) of phosphorus. As a result, the manufacturing cost of the entire nickel layer 3 can be further reduced, and an appearance of the nickel layer 3 can be satisfactorily maintained.

The metal component (lead frame 1) according to the embodiment includes the base material 2, the nickel layer 3, and the noble metal layer 4 in the metal component used for manufacturing a semiconductor device. The base material 2 has electrical conductivity. The nickel layer 3 is formed on the surface 2a of the base material 2 and contains nickel as a main component. The noble metal layer 4 is formed on the surface 3a of the nickel layer 3. The nickel layer 3 includes the first nickel layer 31 not containing phosphorus and the second nickel layer 32 containing phosphorus and having a columnar crystal structure. As a result, in the metal component used for manufacturing a semiconductor device 100, the thickness of the nickel layer 3 can be reduced while good characteristics can be maintained.

In the metal component (lead frame 1) according to the embodiment, the surface 31a of the first nickel layer 31 is a rough. As a result, the lead frame 1 having excellent adhesion to the sealing resin 103 can be implemented.

In the metal component (lead frame 1) according to the embodiment, the first nickel layer 31 is formed on the surface 2a of the base material 2, and the second nickel layer 32 is formed on the surface 31a of the first nickel layer 31. This makes it possible to implement the lead frame 1 in which the wettability of the solder and the bonding characteristics of the bonding wire 102 are compatible with each other at a high level.

In the metal component (lead frame 1) according to the embodiment, the second nickel layer 32 is formed on the surface 2a of the base material 2, and the first nickel layer 31 is formed on the surface 32a of the second nickel layer 32. This makes it possible to reduce the thickness of the nickel layer 3 while maintaining good characteristics in the Pd-PPF.

In the metal component (lead frame 1) according to the embodiment, another second nickel layer (second nickel layer 32B) is formed on the surface 31a of the first nickel layer 31. This makes it possible to implement the lead frame 1 in which the wettability of the solder and the bonding characteristics of the bonding wire 102 are compatible with each other at a high level.

In the metal component (lead frame 1) according to the embodiment, the thickness of the second nickel layer 32 is 0.1 (μm) or more. This makes it possible to maintain good wettability of solder on the surface 1a of the lead frame 1.

In the metal component (lead frame 1) according to the embodiment, the ratio of the thickness of the second nickel layer 32 in the nickel layer 3 is 50% or less. As a result, the manufacturing cost of the entire nickel layer 3 can be further reduced.

In the metal component (lead frame 1) according to the embodiment, the noble metal layer 4 is formed of at least one layer, and the noble metal layer 4 is formed of at least one of palladium, gold, and silver. As a result, formation of an oxide on the surface 1a of the lead frame 1 can be prevented.

Additional effects and modifications may be easily derived by those skilled in the art. Therefore, the broader aspects of the present invention are not limited to the specific details and the representative embodiments shown and described above. Therefore, various modifications can be made without departing from the spirit or scope of the general inventive concept as defined by the appended claims and equivalents thereof.

What is claimed is:

1. A metal component used for manufacturing a semiconductor device, the metal component comprising:
   a base material having an electrical conductivity;
   a nickel layer formed on a surface of the base material and containing nickel as a main component; and
   a noble metal layer formed on a surface of the nickel layer, wherein
   the nickel layer includes a first nickel layer not containing phosphorus, and a second nickel layer containing 0.01 to 0.2 in percent by weight of phosphorus.

2. The metal component according to claim 1, wherein a surface of the first nickel layer has a rough surface.

3. The metal component according to claim 1, wherein the first nickel layer is formed on the surface of the base material, and the second nickel layer is formed on a surface of the first nickel layer.

4. The metal component according to claim 1, wherein the second nickel layer is formed on the surface of the base material, and the first nickel layer is formed on a surface of the second nickel layer.

5. The metal component according to claim 1, wherein the second nickel layer has a thickness of 0.1 μm or more.

6. The metal component according to claim 1, wherein a ratio of a thickness of the second nickel layer in the nickel layer is 50% or less.

7. The metal component according to claim 1, wherein the noble metal layer is formed of at least one layer, and the noble metal layer is formed of at least one of palladium, gold, and silver.

8. A metal component used for manufacturing a semiconductor device, the metal component comprising:

a base material having an electrical conductivity;

a nickel layer formed on a surface of the base material and containing nickel as a main component; and a noble metal layer formed on a surface of the nickel layer, wherein the nickel layer includes a first nickel layer not containing phosphorus, a second nickel layer containing 0.01 to 1 in percent by weight of phosphorus formed on a first surface of the first nickel layer, and a third nickel layer containing 0.01 to 1 in percent by weight of phosphorus is formed on a second surface of the first nickel layer.

\* \* \* \* \*